(12) United States Patent
Koch et al.

(10) Patent No.: US 6,544,810 B1
(45) Date of Patent: Apr. 8, 2003

(54) CAPACITIVELY SENSED MICROMACHINED COMPONENT AND METHOD OF MANUFACTURING

(75) Inventors: Daniel J. Koch, Lakeville, MN (US); Paul L. Bergstrom, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/652,615

(22) Filed: Aug. 31, 2000

(51) Int. Cl.⁷ .............................................. H01L 21/00
(52) U.S. Cl. ........................... 438/48; 438/50; 438/763; 438/659; 438/532
(58) Field of Search ............................. 438/16, 18, 50, 438/479, 517, 532, 659, 763; 310/309

(56) References Cited

U.S. PATENT DOCUMENTS

| | | | |
|---|---|---|---|
| 5,252,881 A | * 10/1993 | Muller et al. | 310/268 |
| 5,492,596 A | 2/1996 | Cho | 156/632.1 |
| 5,616,514 A | * 4/1997 | Muchow et al. | 117/84 |
| 5,833,869 A | 11/1998 | Haas et al. | 216/2 |
| 5,877,094 A | * 3/1999 | Egley et al. | 438/16 |
| 5,937,275 A | 8/1999 | Münzel et al. | 438/50 |

FOREIGN PATENT DOCUMENTS

| WO | 9616203 | 5/1996 |
|---|---|---|

\* cited by examiner

*Primary Examiner*—Hoai Ho
*Assistant Examiner*—Mai-Huong Tran
(74) *Attorney, Agent, or Firm*—Charles W. Bethards

(57) ABSTRACT

A capacitively sensed micromachined component includes an electrically insulative substrate (120) having a first side (121) and a second side (122) opposite the first side. The component also includes a first layer (130) adjacent to the second side of the electrically insulative substrate where at least a first portion of the first layer located adjacent to the second side of the electrically insulative substrate is infrared light absorbing and is also electrically conductive. The component further includes a diffusion and chemical barrier layer (240) encapsulating the first layer and the electrically insulative substrate. The component still further includes a capacitively sensed micromachined device (310) on the diffusion and chemical barrier layer.

28 Claims, 2 Drawing Sheets

CAPACITIVELY SENSED MICROMACHINED COMPONENT AND METHOD OF MANUFACTURING

FIELD OF THE INVENTION

This invention relates to electronics, in general, and more specifically, to capacitively sensed micromachined components and methods of manufacturing.

BACKGROUND OF THE INVENTION

Two-chip inertial sensing systems suffer from at least the following two problems. First, two-chip inertial sensing systems have a low signal-to-noise ratio. Second, the electrical interconnection of the two chips in a two-chip inertial sensing system has large parasitic capacitances.

Monolithic inertial sensing systems eliminate the large parasitic capacitances of the two-chip inertial sensing systems. Monolithic inertial sensing systems also have a higher signal-to-noise ratio than the two-chip inertial sensing systems. Monolithic inertial sensing systems, however, typically require lengthy manufacturing processes. Furthermore, monolithic inertial sensing systems require a more complicated passivation scheme that is compatible with both Complementary Metal-Oxide-Semiconductor (CMOS) and Non-Volatile-Memory (NVM) architectures. Furthermore, monolithic inertial sensing systems also require bond-on-electronics capabilities for wafer bonding.

Accordingly, a need exists for a micromachined component and method of manufacture that provides an inertial sensing system with a high signal-to-noise ratio, a short manufacturing process, and minimal or no modifications to existing CMOS manufacturing processes.

BRIEF DESCRIPTION OF THE DRAWINGS

The invention will be better understood from a reading of the following detailed description, taken in conjunction with the accompanying drawing figures in which.

Figure 1:
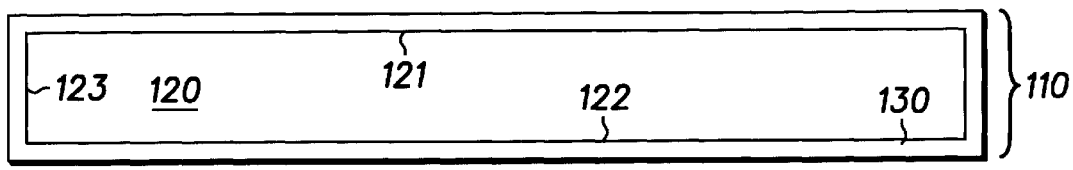
FIGS. 1 and 2 illustrate cross-sectional views of a support substrate of a capacitively sensed micromachined component after different manufacturing steps in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in sequences other than those described or illustrated herein.

Moreover, the terms over, under, and the like in the description and in the claims, if any, are used for descriptive purposes and not necessarily for describing relative positions. It is understood that the terms so used are interchangeable under appropriate circumstances and that the embodiments of the invention described herein are capable of operation in orientations other than those described or illustrated herein.

DETAILED DESCRIPTION OF THE DRAWINGS

FIGS. 1 through 5 illustrate cross-sectional views of a micromachined component 100 after different steps of a manufacturing process. In the preferred embodiment, component 100 is a capacitively sensed micromachined component such as, for example, an inertial sensor, an accelerometer, or an angular rate sensor. Component 100 is compatible with two-chip inertial sensing systems, but does not have the disadvantage of large parasitic capacitances in the electrical interconnection between the two chips.

The manufacturing process or method of manufacturing component 100 includes providing a support substrate 110 having a diffusion and chemical barrier layer 240, as explained in more detail with reference to FIGS. 1 and 2. The manufacturing process or method also includes forming a capacitively sensed micromachined device 310 on diffusion and chemical barrier layer 240 of support substrate 110, as explained in more detail with reference to FIGS. 3 through 5. As an example, device 310 can be a resonating structure, an anodically bonded switching structure, or the like.

Turning to FIG. 1, an electrically insulative substrate 120 is provided to have a first side 121 and a second side 122 opposite side 121. Substrate 120 also has a side surface 123 coupling together sides 121 and 122. As an example, substrate 120 can be comprised of a material selected from the group consisting of quartz, glass, alumina, zirconia, sapphire, mullite, and plastic or the like. In the preferred embodiment, substrate 120 consists of quartz. Also in the preferred embodiment, substrate 120 is not comprised of a semiconductor material because a semiconductor material is semi-insulating and is not electrically insulative thereby substantially reducing parasitic capacitance associated with component 310.

A first layer 130 is formed adjacent to sides 121 and 122 of substrate 120. In the preferred embodiment, layer 130 is also formed adjacent to side surface 123 of substrate 120. At least a first portion of layer 130 located adjacent to side 122 of substrate 120 is both infra-red light absorbing and electrically conductive so as to facilitate known manufacturing process requirements. In the preferred embodiment, all of layer 130 is both infra-red light absorbing and electrically conductive. Also in the preferred embodiment, all of layer 130 is optically opaque, again to facilitate manufacturing processes.

As an example, layer 130 can be comprised of a material selected from the group consisting of a refractory metal and doped polysilicon. As an example, the refractory metal can be comprised of a material selected from the group consisting of tungsten, titanium, tantalum, and vanadium. In the preferred embodiment, layer 130 consists of doped polysilicon to avoid the introduction of potential contaminants in the optional CMOS devices in component 100.

In the preferred embodiment, layer 130 has a thickness greater than approximately 2 micrometers such that layer 130 is optically opaque. As an example, when layer 130 consists of doped polysilicon, layer 130 can be formed using the following process. First, a 3 micrometer thick layer of undoped polysilicon is deposited to encapsulate substrate 120. As an example, a Low-Pressure Chemical Vapor Deposition (LPCVD) process can be used to deposit layer 130 simultaneously adjacent to sides 121 and 122 and side surface 123. This deposition process encapsulates substrate 120 with layer 130. Next, layer 130 can be doped with phosphorous at a temperature of approximately 950 degrees Celsius. In the preferred embodiment, portions of layer 130 located at sides 121 and 122 of substrate 120 are heavily doped to a resistivity below approximately 20 ohms per square. This heavy doping of layer 130 provides the infra-red light absorbing and electrically conductive characteristics of layer 130.

Next, a portion of layer 130 located adjacent to side 121 of substrate 120 is removed. As an example, an etch mask comprised of photoresist can be coated over the portions of layer 130 located adjacent to side 122 and side surface 123 of substrate 120. Then, an etchant can be applied to the exposed portion of layer 130 located at side 121 of substrate 120. After the etching process, the etch mask is removed.

Figure 2:
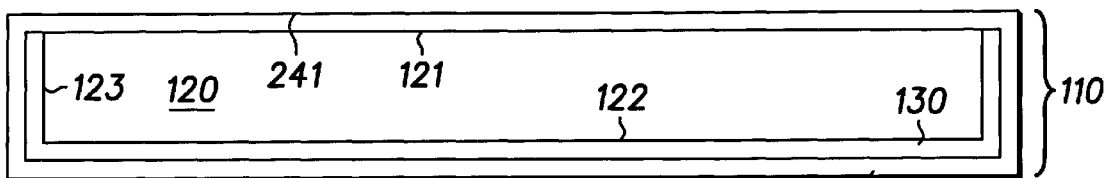

Next, turning to FIG. 2, the remaining portions of layer 130 and the exposed portion of substrate 120 are encapsulated with diffusion and chemical barrier layer 240. Layer 240 protects substrate 120 and layer 130 from the etchants used to manufacture the micromachined device of component 100. Layer 240 makes substrate 110 compatible with conventional micromachining processing and CMOS processing.

As an example, layer 240 can be comprised of a material selected from the group consisting of a metallic oxide, a metallic nitride, silicon nitride, and silicon dioxide. As an example, the metallic oxide can be comprised of alumina, and the metallic nitride can be comprised of a material selected from the group consisting of aluminum nitride and titanium nitride. In the preferred embodiment, layer 240 is comprised of silicon nitride.

As an example, when layer 240 consists essentially of silicon nitride, a LPCVD process can be used to deposit layer 240 to a thickness of approximately 250 nanometers. Layer 240 forms a side 241 and an opposite side 242 for substrate 110.

Figure 3:
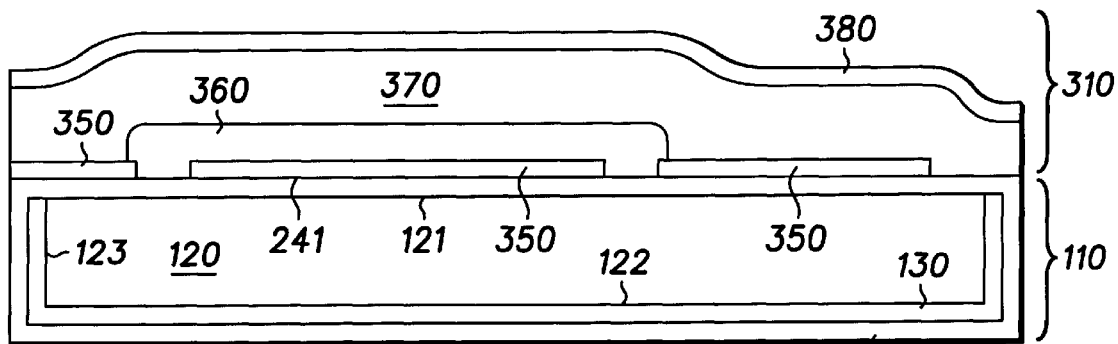
FIGS. 3, 4, and 5 illustrate cross-sectional views of the capacitively sensed micromachined component after different manufacturing steps in accordance with an embodiment of the invention.
Figure 4:
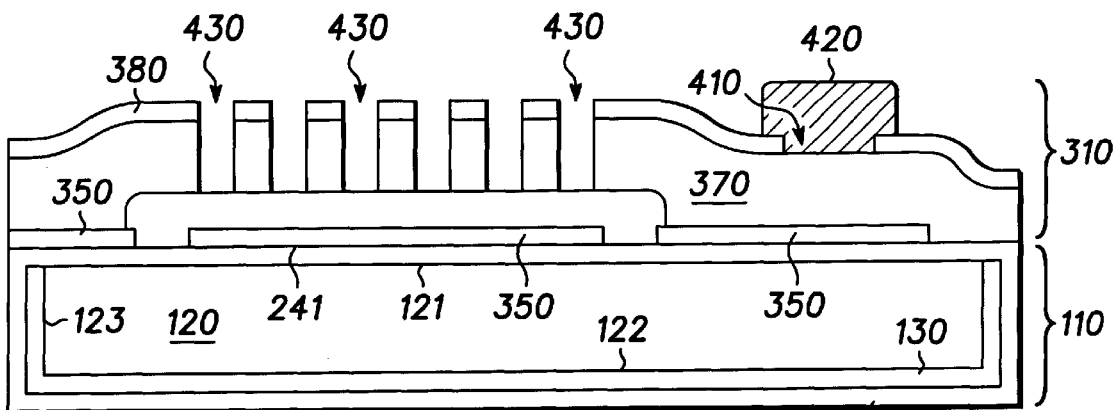
Figure 5:
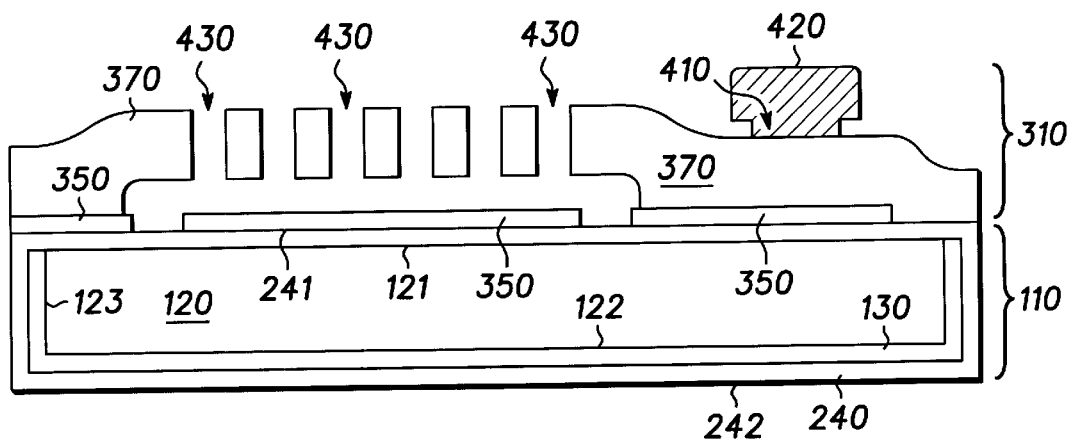

Next, in FIGS. 3 through 5, capacitively sensed micromachined device 310 is formed on layer 240 of substrate 110. Layer 240 remains between substrate 120 and device 310. As illustrated in FIG. 3, an electrically conductive layer 350 is formed over side 121 of substrate 120 and side 241 of substrate 110 and on layer 240 and then patterned with known etching processes to form area 350a. As an example, layer 350 can be comprised of doped polysilicon deposited using a LPCVD process or an epitaxial or polycrystalline process. Layer 350, specifically 350a, represents one of the electrical terminals of component 100 and is accessed via a connection, not shown, that is outside the area depicted in FIGS. 3 through 5. Next, a sacrificial layer 360 is formed over area 350a. As an example, layer 360 can be comprised of Phospho-Silicate-Glass (PSG). Then, another conductive layer 370 is formed over layers 350 and 360. As an example, layer 370 can be comprised of a material similar to that used for layer 350. Portions of layer 370 are electrically coupled to portions of layer 350 but not area 350a. Subsequently, an electrically insulative layer 380 is formed over layer 370. As an example, layer 380 can be comprised of a material similar to that used for layer 360.

In FIG. 4, a hole 410 is etched into layer 380, and an electrical contact 420 is formed in and over hole 410 to electrically contact layer 370. As an example, electrical contact 420 can be comprised of aluminum silicon. Next, holes 430 are etched into layers 380 and 370 to expose portions of sacrificial layer 360, which portion corresponds largely to area 350a. Then, layers 360 and 380 are removed in a sacrificial etch process, as illustrated in FIG. 5. The removal of layer 360 releases portions of layer 370 such that the released portions of layer 370 are moveable relative to layer 350a.

It will be evident to one of ordinary skill that area 370 and area 350 (350a) can be constructed into a plurality of electrically isolated areas. For example, the preferred form includes a multiplicity of separate areas arranged and connected in parallel to form more than one device such or device 310. This concept is explained in detail in U.S. Pat. No. 6,070,464, titled: SENSING STRUCTURE COMPRISING A MOVABLE MASS AND A SELF TEST STRUCTURE by Koury et al., issued on Jun. 6, 2000 and hereby incorporated herein.

Component 100 can also include other features such as, for example, a capping wafer bonded to substrate 110 to hermetically seal device 310. Furthermore, an electrically conductive layer can be deposited adjacent to side 242 of substrate 110 to provide Electro-Magnetic Interference (EMI) shielding. As an example, this electrically conductive layer can be comprised of aluminum silicon and is preferably formed before removal of sacrificial layer 360 (FIGS. 3 and 4). Alternatively, the portion of layer 240 located adjacent to side 122 of substrate 120 can be removed prior to the deposition of this electrically conductive layer.

Figure 6:
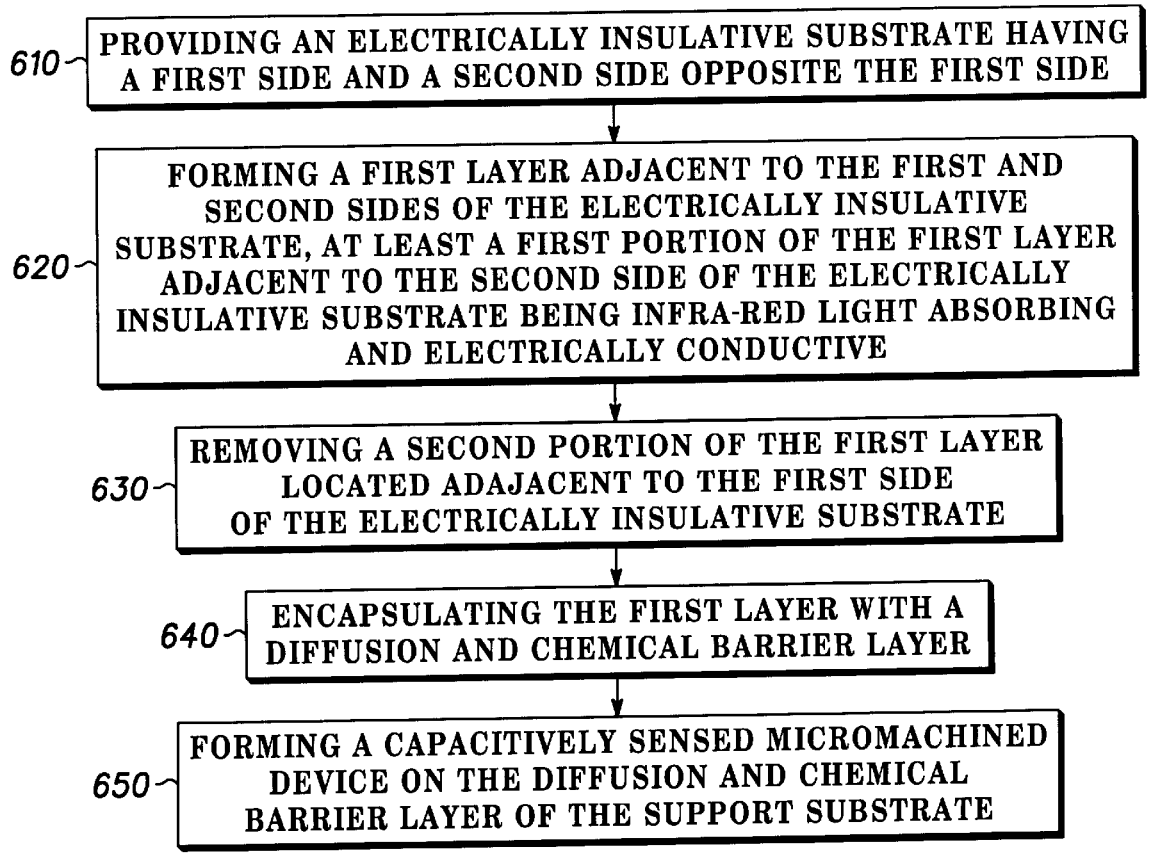
FIG. 6 illustrates a flow chart of a method of manufacturing the capacitively sensed micromachined component.

FIG. 6 illustrates a flow chart 600 of a method of manufacturing a capacitively sensed micromachined component. At a step 610 of flow chart 600, an electrically insulative substrate having a first side and a second side opposite the first side is provided. Next, at a step 620, a first layer is formed adjacent to the first and second sides of the electrically insulative substrate. At least a first portion of the first layer located adjacent to the second side of the electrically insulative substrate is infra-red light absorbing and electrically conductive. Subsequently, at a step 630, a second portion of the first layer located adjacent to the first side of the electrically insulative substrate is removed. Then, at a step 640 of flow chart 600, the first layer is encapsulated with a diffusion and chemical barrier. Next, at a step 650, a capacitively sensed micromachined device is formed on the diffusion and chemical barrier layer.

Therefore, a micromachined component and method of manufacture is provided to overcome the disadvantages of the prior art. The component enables two-chip inertial sensing systems that have low parasitic capacitances associated with the component, a high signal-to-noise ratio, a shortened manufacturing process compared to the monolithic inertial sensing systems, and minimal or no modifications to existing CMOS manufacturing processes.

Although the invention has been described with reference to specific embodiments, it will be understood by those skilled in the art that various changes may be made without departing from the spirit or scope of the invention. For instance, the numerous details set forth herein such as, for example, the material compositions and the layer thicknesses are provided to facilitate the understanding of the invention and are not provided to limit the scope of the invention. Furthermore, the specific capacitively sensed micromachined component described herein is provided as an example. Moreover, the concept of using a backside polysilicon coating to make substrates compatible with a conventional CMOS manufacturing process can be extended to thin film transistor technologies and Active Matrix Liquid Crystal Display (AMLCD) technologies. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a capacitively sensed micromachined component comprising:
providing a support substrate comprised of:
an electrically insulative substrate having a first side and a second side opposite the first side;
a first layer adjacent to the second side of the electrically insulative substrate, at least a first portion of the first layer adjacent to the second side of the electrically insulative substrate being infra-red light absorbing and electrically conductive; and a diffusion and chemical barrier layer encapsulating the first layer and the electrically insulative substrate; and forming a capacitively sensed micromachined device on the diffusion and chemical barrier layer.

2. The method of claim 1 wherein:
providing the support substrate further comprises:
providing the first layer comprised of a material selected from the group consisting of a refractory metal and doped polysilicon.

3. The method of claim 2 wherein:
providing the support substrate further comprises:
providing the refractory metal comprised of a material selected from the group consisting of tungsten, titanium, tantalum, and vanadium.

4. The method of claim 1 wherein:
providing the support substrate further comprises:
providing the diffusion and chemical barrier layer comprised of a material selected from the group consisting of a metallic oxide, a metallic nitride, silicon nitride, and silicon dioxide.

5. The method of claim 4 wherein:
providing the support substrate further comprises:
providing the metallic oxide comprised of alumina; and
providing the metallic nitride comprised of a material selected from the group consisting of aluminum nitride and titanium nitride.

6. The method of claim 1 wherein:
providing the support substrate further comprises:
providing the electrically insulative substrate with a side surface coupling together the first and second sides; and
providing a third portion of the first layer adjacent to the side surface.

7. The method of claim 6 wherein:
providing the support substrate further comprises:
providing the third portion of the first layer encapsulated by the diffusion and chemical barrier layer.

8. The method of claim 1 wherein:
providing the support substrate further comprises:
providing the first layer to be optically opaque.

9. The method of claim 1 wherein:
providing the support substrate further comprises:
providing the electrically insulative substrate comprised of a material selected from the group consisting of quartz, glass, alumina, zirconia, sapphire, mullite, and plastic.

10. The method of claim 1 wherein:
forming the capacitively sensed micromachined device further comprises:
forming a first electrically conductive layer over the first side of the electrically insulative substrate and on the diffusion and chemical barrier layer;
forming a sacrificial layer over the first electrically conductive layer;
forming a second electrically conductive layer over the sacrificial layer; and
removing the sacrificial layer after forming the second electrically conductive layer.

11. The method of claim 1 wherein:
providing the support substrate further comprises:
providing the support substrate comprised of:
the first layer located on the second side of the electrically insulative substrate.

12. The method of claim 11 wherein:
providing the support substrate further comprises:
providing the support substrate comprised of:
the first layer absent adjacent to the first side of the electrically insulative substrate; and
the diffusion and chemical barrier layer located on the first side of the electrically insulative substrate.

13. The method of claim 1 wherein:
providing the support substrate further comprises:
providing the support substrate comprised of:
the diffusion and chemical barrier layer located on the first layer and the electrically insulative substrate.

14. The method of claim 1 wherein:
providing the support substrate further comprises:
providing the support substrate comprised of:
all of the first layer being infra-red light absorbing and electrically conductive.

15. A method of manufacturing a support substrate for a capacitively sensed micromachined component comprising:
providing an electrically insulative substrate having a first side and a second side opposite the first side;
forming a first layer adjacent to the first and second sides of the electrically insulative substrate, at least a first portion of the first layer adjacent to the second side of the electrically insulative substrate being infra-red light absorbing and electrically conductive;
removing a second portion of the first layer located adjacent to the first side of the electrically insulative substrate; and
encapsulating the first layer with a diffusion and chemical barrier layer after removing the second portion of the first layer.

16. The method of claim 15 wherein:
forming the first layer further comprises:
providing the first layer comprised of a material selected from the group consisting of a refractory metal and doped polysilicon.

17. The method of claim 16 wherein:
forming the first layer further comprises:
providing the refractory metal comprised of a material selected from the group consisting of tungsten, titanium tantalum and vanadium.

18. The method of claim 15 wherein:
encapsulating the first layer further comprises:
providing the diffusion and chemical barrier layer comprised of a material selected from the group consisting of a metallic oxide, a metallic nitride, silicon nitride, and silicon dioxide.

19. The method of claim 18 wherein:
encapsulating the first layer further comprises:
providing the metallic oxide comprised of alumina; and
providing the metallic nitride comprised of a material selected from the group consisting of aluminum nitride and titanium nitride.

20. The method of claim 15 wherein:
providing the electrically insulative substrate further comprises:
providing the electrically insulative substrate with a side surface coupling together the first and second sides; and
forming the first layer further comprises:
forming a third portion of the first layer adjacent to the side surface.

21. The method of claim 20 wherein:
encapsulating the first layer further comprises:
  encapsulating the third portion of the first layer with the diffusion and chemical barrier layer.

22. The method of claim 15 wherein:
forming the first layer further comprises:
  providing the first layer to be optically opaque.

23. The method of claim 15 wherein:
providing the electrically insulative substrate further comprises:
  providing the electrically insulative substrate comprised of a material selected from the group consisting of quartz, glass, alumina, zirconia, sapphire, mullite, and plastic.

24. The method of claim 15 wherein:
providing the electrically insulative substrate further comprises:
  providing the electrically insulative substrate to consist of quartz;
forming the first layer further comprises:
  encapsulating the electrically insulative substrate with an undoped polysilicon layer; and
  doping the undoped polysilicon layer at the first and second sides of the electrically insulative substrate to a resistivity below approximately 20 ohms per square; and
encapsulating the first layer further comprises:
  encapsulating the first layer and the electrically insulative substrate with a silicon nitride layer.

25. The method of claim 15 wherein:
forming the first layer further comprises:
  forming the first layer on the first and second sides of the electrically insulative substrate.

26. The method of claim 25 wherein:
encapsulating the first layer further comprises:
  encapsulating the first layer and the electrically insulative substrate with the diffusion and chemical barrier layer after removing the second portion of the first layer.

27. The method of claim 26 wherein:
removing the second portion of the first layer further comprises:
  removing the second portion of the first layer located adjacent to the first side of the electrically insulative substrate to expose the first side of the electrically insulative substrate; and
encapsulating the first layer further comprises:
  providing the diffusion and chemical barrier layer on the first layer and the electrically insulative substrate.

28. The method of claim 27 wherein:
forming the first layer further comprises:
  forming all of the first layer to be infra-red light absorbing and electrically conductive.

* * * * *